(12) United States Patent
Colvin et al.

(10) Patent No.: US 11,699,563 B2
(45) Date of Patent: Jul. 11, 2023

(54) ETCHING ALUMINUM NITRIDE OR ALUMINUM OXIDE TO GENERATE AN ALUMINUM ION BEAM

(71) Applicant: Axcelis Technologies, Inc., Beverly, MA (US)

(72) Inventors: Neil K. Colvin, Merrimack, NH (US); Neil Bassom, Hamilton, MA (US); Xiao Xu, Needham, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 17/339,085

(22) Filed: Jun. 4, 2021

(65) Prior Publication Data
US 2022/0139662 A1    May 5, 2022

Related U.S. Application Data

(60) Provisional application No. 63/107,769, filed on Oct. 30, 2020.

(51) Int. Cl.
*H01J 27/22* (2006.01)
*H01J 37/08* (2006.01)

(52) U.S. Cl.
CPC .............. *H01J 27/22* (2013.01); *H01J 37/08* (2013.01); *H01J 2237/08* (2013.01); *H01J 2237/31701* (2013.01)

(58) Field of Classification Search
CPC ................... H01J 27/22; H01J 2237/08; H01J 2237/31701
See application file for complete search history.

(56) References Cited

U.S. PATENT DOCUMENTS

| | | | | |
|---|---|---|---|---|
| 4,902,529 A | * | 2/1990 | Rebhan | B29C 59/14 427/580 |
| 6,635,880 B1 | * | 10/2003 | Renau | H01J 37/3171 250/492.2 |

(Continued)

FOREIGN PATENT DOCUMENTS

| | | | | |
|---|---|---|---|---|
| EP | 2891172 B1 | * | 10/2019 | ............ H01J 27/08 |
| JP | 11238485 A | * | 8/1999 | |
| JP | H11238485 A | | 8/1999 | |

OTHER PUBLICATIONS

"International Search Report and Written Opinion for PCT Patent Application No. PCT/US2021/049406", dated Jan. 10, 2022, 15 Pages.

*Primary Examiner* — David E Smith
(74) *Attorney, Agent, or Firm* — Eschweiler & Potashnik, LLC

(57) ABSTRACT

An ion implantation system, ion source, and method are provided, where an ion source is configured to ionize an aluminum-based ion source material and to form an ion beam and a by-product including a non-conducting material. An etchant gas mixture has a predetermined concentration of fluorine and a noble gas that is in fluid communication with the ion source. The predetermined concentration of fluorine is associated with a predetermined health safety level, such as approximately a 20% maximum concentration of fluorine. The etchant gas mixture can have a co-gas with a concentration less than approximately 5% of argon. The aluminum-based ion source material can be a ceramic member, such as a repeller shaft, a shield, or other member within the ion source.

14 Claims, 2 Drawing Sheets

(56) References Cited

U.S. PATENT DOCUMENTS

| | | |
|---|---|---|
| 2003/0122089 A1 | 7/2003 | Murrell et al. |
| 2003/0234371 A1 | 12/2003 | Ziegler |
| 2010/0051825 A1* | 3/2010 | Yamashita ............... H01J 27/14 250/423 R |
| 2018/0346342 A1* | 12/2018 | Colvin ...................... C01F 7/48 |
| 2019/0348252 A1* | 11/2019 | Colvin ................ H01J 37/3171 |

* cited by examiner

ETCHING ALUMINUM NITRIDE OR ALUMINUM OXIDE TO GENERATE AN ALUMINUM ION BEAM

REFERENCE TO RELATED APPLICATIONS

This application claims the benefit of U.S. Provisional Application Ser. No. 63/107,769 filed Oct. 30, 2020, the contents of all of which are herein incorporated by reference in their entirety.

FIELD

The present invention relates generally to ion implantation systems, and more specifically to an ion implantation system configured to generate an ion beam comprising aluminum ions.

BACKGROUND

There is increasing demand for ion implants using metal ions. For example, aluminum implants are important for the power device market, which is a small but fast-growing segment of the market. For many metals, including aluminum, supplying feed material to the ion source is problematic. Systems have been previously provided that utilize a vaporizer, which is a small oven that is external to the arc chamber of the ion source, whereby metal salts are heated to produce adequate vapor pressure to supply vapor to the ion source. The oven, however, is remote from the arc chamber and takes time to heat up to the desired temperature, establish the vapor flow, start the plasma, start the ion beam, etc. Further, if a change from one metal species to some other species is desired, time is taken in waiting for the oven to cool down adequately for such a change in species.

Another conventional technique is to place a metal-containing material such as aluminum or another metal inside the arc chamber. For aluminum, the metal-containing material may comprise aluminum oxide, aluminum fluoride, or aluminum nitride, all of which can withstand the approximately 800 C temperatures of the plasma chamber. In such a system, ions are sputtered directly off the material in the plasma. Another technique is to use a plasma containing an etchant such as fluorine to attain chemical etching of the metal. While acceptable beam currents can be attained using these various techniques, compounds of aluminum oxide, aluminum chloride, and aluminum nitride, all of which are good electrical insulators, tend to be deposited on electrodes adjacent to the ion source in a relatively short period of time (e.g., 5-10 hours). As such, various deleterious effects are seen, such as high voltage instabilities and associated variations in dosage of ions being implanted.

SUMMARY

The present disclosure thus provides a system and apparatus for generating an ion beam comprising aluminum ions. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with one aspect of the disclosure, an ion implantation system is provided, wherein an ion source is configured to ionize an aluminum-based ion source material and form an ion beam therefrom. In one example, the aluminum-based ion source material comprises a ceramic member, wherein the ceramic member comprises one or more of a repeller shaft, a shield, or a member within the ion source.

The ionization of the aluminum-based ion source material, for example, further forms a by-product comprising a non-conducting material. An etchant gas mixture is further in fluid communication with the ion source, wherein the etchant gas mixture comprises a predetermined concentration of fluorine and a noble gas. A beamline assembly is further configured to selectively transport the ion beam to an end station for implantation of ions into a workpiece. A vacuum system, for example, can be configured to substantially evacuate the ion source.

According to one example, the noble gas comprises one or more of helium and argon, wherein the predetermined concentration of fluorine is associated with a predetermined health safety level. In one example, the predetermined health safety level is a 20% maximum concentration of fluorine. In another example, the etchant gas mixture comprises a pressurized gas source comprising a non-reacted mixture of ≤20% fluorine with helium. The pressurized gas source can further comprise a co-gas. The co-gas, for example, can comprise argon in a concentration of less than 5%. In another example, the etchant gas mixture can comprise the co-gas.

The etchant gas mixture, for example, is in a pre-mixed form within a pressurized bottle and comprises a mixture of fluorine and one or more of argon and helium gases. In one example, the container comprises approximately 20% or less of fluorine. In another example, the pressurized bottle further comprises less than approximately 5% argon.

In accordance with another example aspect of the disclosure, an ion implantation system is provided, wherein an ion source configured to ionize an aluminum-based source material and form an ion beam therefrom. The ionization of the aluminum-based source material further forms a by-product comprising a non-conducting material. An etchant gas supply comprising an etchant gas mixture of fluorine mixed with a noble gas is further provided, wherein the etchant gas supply is configured to introduce the etchant gas mixture to the ion source, wherein the fluorine is mixed with a noble gas at a health safety concentration. A beamline assembly selectively transports the ion beam to an end station that is configured to accept the ion beam for implantation of ions into a workpiece.

In one example, the etchant gas mixture further comprises a co-gas. The co-gas, for example, comprises argon, such as argon gas at a concentration of less than 5%. The etchant gas supply, for example, can comprise a pressurized gas source. The pressurized gas source, for example, can comprise a pressurized bottle containing the etchant gas mixture. The etchant gas mixture, for example, is provided a pre-mixed form in a container, such as a pressurized bottle containing a mixture of fluorine and one or more of argon and helium gases. The container, for example, comprises approximately 20% or less of fluorine.

In accordance with yet another example aspect of the disclosure, a method for implanting aluminum ions into a workpiece is provided. The method, for example, comprises providing an aluminum-based source material in an ion source and providing an etchant gas mixture to the ion source, wherein the etchant gas mixture comprises a predetermined concentration of fluorine and a noble gas. The predetermined concentration of fluorine, for example, is less than approximately 20%. In one example, the aluminum-based source material comprises a ceramic member. The noble gas, for example, can comprise one or more of argon and helium. The aluminum-based source material is ionized in the ion source, wherein the fluorine etches aluminum-based source material to produce aluminum ions. Further, aluminum ions are implanted from the ionized aluminum-based source material into a workpiece.

In another example, providing the etchant gas mixture to the ion source further comprises providing a co-gas, such as argon, to the ion source. In another example, the method further comprises pre-mixing the etchant gas in a container, such as in a pressurized bottle containing a mixture of fluorine and one or more of argon and helium gases. The container, for example, comprises approximately 20% fluorine. In another example, the container comprises less than approximately 5% argon.

To the accomplishment of the foregoing and related ends, the disclosure comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
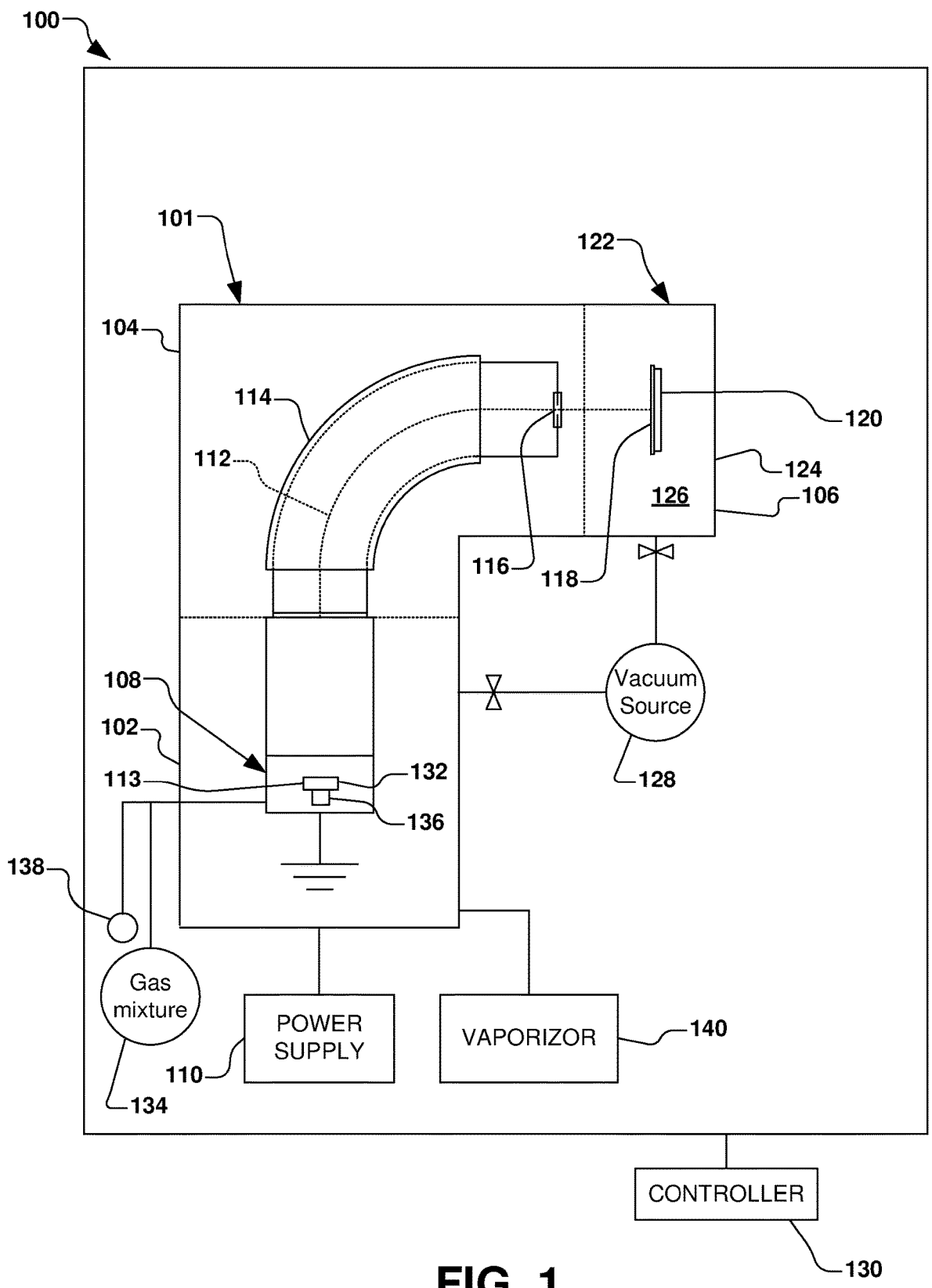
FIG. 1 is a block diagram of an exemplary vacuum system utilizing an aluminum-based ion source material in accordance with several aspects of the present disclosure.

The present disclosure is directed generally toward an ion implantation system and an ion source material associated therewith. More particularly, the present disclosure is directed toward components for said ion implantation system using an aluminum-based solid source material for producing atomic ions to electrically dope silicon, silicon carbide, or other semiconductor substrates at various temperatures, ranging up to 1000° C. Further, the present disclosure minimizes various deposits on extraction electrodes and source chamber components when using a pre-mixed etchant gas comprising a predetermined mixture of fluorine and a noble or inert gas such as helium. The present disclosure will reduce source operating pressures, increase etch rates and minimize the sputter rate of the aluminum-containing material, which will further increase overall lifetimes and aluminum ion beam currents.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

Ion implantation is a physical process that is employed in semiconductor device fabrication to selectively implant dopant into semiconductor and/or wafer material. Thus, the act of implanting does not rely on a chemical interaction between a dopant and semiconductor material. For ion implantation, dopant atoms/molecules from an ion source of an ion implanter are ionized, accelerated, formed into an ion beam, analyzed, and swept across a wafer, or the wafer is translated through the ion beam. The dopant ions physically bombard the wafer, enter the surface and come to rest below the surface, at a depth related to their energy.

Ion sources in ion implanters typically generate the ion beam by ionizing a source material in an arc chamber, wherein a component of the source material is a desired dopant element. The desired dopant element is then extracted from the ionized source material in the form of the ion beam.

Conventionally, when aluminum ions are the desired dopant element, materials such as aluminum nitride (AlN) and alumina ($Al_2O_3$) have been used as a source material of aluminum ions for the purpose of ion implantation. Aluminum nitride or alumina are solid, insulative materials which are typically placed in the arc chamber where the plasma is formed (in the ion source).

A gas (e.g., fluorine) is introduced to chemically etch the aluminum-containing materials, whereby the source material is ionized, and aluminum is extracted and transferred along the beamline to a workpiece (e.g., silicon carbide) positioned in an end station for implantation thereto. The aluminum-containing materials, for example, are commonly used with some form of fluorine-based etchant gas (e.g., $BF_3$, $PF_3$, $NF_3$, SiF4, $SF_6$, etc.) in the arc chamber as the source material of the aluminum ions. These materials, however, have the unfortunate side effect of producing insulating material (e.g., AlN, $Al_2O_3$, $AlF_3$ etc.) which is emitted along with the intended aluminum ions from the arc chamber.

The insulating material subsequently coats various components of the ion source, such as extracting electrodes, which then begin to build an electric charge and unfavorably alter the electrostatic characteristic of the extraction electrodes. The consequence of the electric charge build-up results in behavior commonly referred to as arcing, or "glitching", of the extraction electrodes as the built-up charge arcs to other components and or to ground.

In extreme cases, behavior of a power supply for the extraction electrodes can be altered and distorted. This typically results in unpredictable beam behavior and leads to reduced beam currents and frequent preventive maintenance to clean the various components associated with the ion source. Additionally, flakes and other residue from these materials can form in the arc chamber, thus altering its operational characteristics, leading to additional frequent cleaning.

Further, with the use of $BF_3$, for example, there is a concern that an air leak in the gas delivery system can cause the formation of BO (AMU 27), which is mass-coincident with aluminum (AMU 27), whereby BO can be implanted along with the desired aluminum ions. When using $BF_3$ as an etchant, for example, it has been observed that extraction electrode optics coat with boron that can subsequently delaminate and cause arcing between the electrode and the arc chamber arc slit, thus rendering the tool unstable for production. The use of $NF_3$, for example, can also be a problem as the mass of the nitrogen molecule+ (AMU28) is close to that of aluminum+ (AMU 27) and may pass through the mass resolving system, resulting in the implantation of energetic contamination. A similar concern exists over the close mass/charge ratio of the atomic nitrogen and doubly-charged aluminum (Al++ with mass/charge ratios of 14 and 13.5 respectively). In addition, it has been observed that the use of such molecules reduces the ability to achieve desired aluminum beam currents, particularly for multiply-charged ions.

The present disclosure thus seeks to minimize deposits on extraction electrodes and other components associated with an ion source chamber, while also providing desired beam currents when implanting aluminum ions. The present disclosure advantageously reduces glitching or arcing associated with in formation, and further increases overall ion source and electrode lifetimes with increased efficiencies.

In accordance with one example aspect of the disclosure, an aluminum-based sputter/etch target is provided in conjunction with an etchant source gas. The etchant source gas is advantageously provided in a pre-mixed form in a container (e.g., a gas bottle) containing helium (He) with a predetermined percentage of fluorine ($F_2$) to allow for a lower overall gas flow over conventional systems, while providing a lower arc chamber pressure and a further reduction in secondary collisions (e.g., charge exchange) due to the small ionization cross-section of helium when compared to other conventional fluorine-containing molecules and mixtures.

The inventors have observed that for a required aluminum beam current, the total extraction current can be reduced by >20% as the fluorine donor atom (e.g., boron, phosphorous, silicon) will not be ionized and extracted. The first ionization energy of helium of 24.57 is the highest of any element, and its contribution to the total extraction current is negligible. This reduction in extracted current will also reduce the pressure between the arc chamber optics plate and the extraction electrode and reduce arcing between the two surfaces. This is beneficial for improved beam stability, as over time, the extraction electrode will be coated with insulating material, as previously discussed. The present disclosure appreciates that, in some instances, a mixture of a noble or inert gas other than helium pre-mixed with a predetermined percentage of fluorine may be preferred, based on operational conditions or desired implants. For example, argon (Ar) can be pre-mixed with fluorine and helium in the container and provided to the arc chamber in a case where sputtering of the aluminum-based ceramic is desired. When etching AlN or $Al_2O_3$ in a fluorine-based plasma, for example, a stable/non-volatile film of $AlF_3$ can form on a surface of the aluminum-based ceramic, thus passivating the surface. In such an instance, Ar+ ions can sputter the surface and remove the fluoride or maintain the surface as fluoride-free such that further reactions may occur, such as:

$$AlN+F_2 \rightarrow AlF_3+N_2 \qquad (1)$$

or

$$Al_2O_3+F_2 \rightarrow AlF_3+O_2 \qquad (2).$$

The present disclosure further contemplates that, if the concentration of argon in a pre-mixed bottle of argon+fluorine causes a reduction in aluminum beam currents due to charge exchange, for example, the bottle can be filled with three or more gases, where the primary or highest level of gas, for example, is helium and the remaining balance is a predetermined percentage of fluorine, argon, or other noble, inert, or otherwise non-reactive gas.

In order to gain a better understanding of the disclosure, in accordance with one aspect of the present disclosure, FIG. 1 illustrates an exemplary vacuum system 100. The vacuum system 100 in the present example comprises an ion implantation system 101, however various other types of vacuum systems are also contemplated, such as plasma processing systems, or other semiconductor processing systems. The ion implantation system 101, for example, comprises a terminal 102, a beamline assembly 104, and an end station 106.

Generally speaking, an ion source 108 in the terminal 102 is coupled to a power supply 110 to ionize a dopant gas into a plurality of ions from the ion source to form an ion beam 112. Individual electrodes in close proximity to the extraction electrode may be biased to inhibit back streaming of neutralizing electrons close to the source or back to the extraction electrode. An ion source material 113 of the present disclosure is provided in the ion source 108, wherein the ion source material comprises an aluminum-based source material such as solid aluminum oxide ($Al_2O_3$), aluminum nitride (AlN), or other aluminum-containing material.

The ion beam 112 in the present example is directed through a beam-steering apparatus 114, and out an aperture 116 towards the end station 106. In the end station 106, the ion beam 112 bombards a workpiece 118 (e.g., a semiconductor such as a silicon wafer, a display panel, etc.), which is selectively clamped or mounted to a chuck 120 (e.g., an electrostatic chuck or ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber. Further, a controller 130 is provided for overall control of the vacuum system 100.

The present disclosure appreciates that workpieces 118 having silicon carbide-based devices formed thereon have been found to have better thermal and electrical characteristics than silicon-based devices, in particular, in applications used in high voltage and high temperature devices, such as electric cars, etc. Ion implantation into silicon carbide, however, utilizes a different class of implant dopants than those used for silicon workpieces. In silicon carbide implants, aluminum, nitrogen and phosphorous implants are often performed. Nitrogen and phosphorous implants, for example, are relatively simple, as the nitrogen can be introduced as a gas, and provides relatively easy tuning, cleanup, etc. Aluminum, however, is more difficult, as there are presently no good gaseous solutions of aluminum known.

The present disclosure contemplates the ion source material 113, for example, as being an aluminum-based ion source material 132. Further, an etchant gas mixture 134 is provided, whereby an introduction of the etchant gas mixture advantageously provides high ion beam currents with minimal deleterious issues associated with the higher pressures associated larger molecular mass materials further amplifying the negative effects due to the formation of either insulating and or and conductive materials discussed above. In one particular example, the present disclosure contemplates the aluminum-based ion source material 132 as comprising aluminum oxide ($Al_2O_3$) or aluminum nitride (AlN) to produce atomic aluminum ions in conjunction with the etchant gas mixture 134, wherein the etchant gas mixture comprises a non-reacted mixture of a predetermined percentage of fluorine along with a noble or inert gas. As such, due, at least in part to the aforementioned increased pressures in the high voltage gap between the ion source arc slit and extraction electrode, the effect of insulating materials, flakes, etc., are not as detrimental, thus extending the lifetime of the ion source and electrodes, producing a more stable ion beam operation, and allowing substantially higher beam currents.

For example, the aluminum-based ion source material 132 is incorporated into a ceramic member 136 (e.g., a repeller shaft, shield, or other member within the ion source 108), wherein the ceramic is sputtered or etched using the fluorine gas from the etchant gas mixture 134. The aluminum-based ion source material 132, for example, undergoes a high temperature process (e.g., 1000 C or higher), whereby the ceramic is able to withstand such temperatures without melting.

Thus, the present disclosure produces single atom ions, such as aluminum ions, to electrically dope a silicon carbide, silicon, or other substrate, at temperatures from room temperature to approximately 1000° C. or greater. Such a production of single atom ions advantageously yields improved source lifetimes, higher beam currents, and better operational characteristics than current techniques.

In accordance with an alternative aspect of the present disclosure, the aluminum-based ion source material can be provided to the ion source 108 via a solid source vaporizer 140 of the ion implantation system 101 (e.g., a suitable ion implanter manufactured by Axcelis Technologies of Beverley, Mass.). The solid source vaporizer 140 associated with the ion source 108, for example, can be loaded with aluminum-based ion source material and heated in the vaporizer until it forms a vapor which migrates to the ionization chamber where the aluminum is ionized and extracted down the beamline.

The present disclosure further appreciates that the provision of fluorine gas in concentrations greater than a predetermined health safety level (e.g., 10-20% concentration) can be a safety issue with transportation and storage of the bottle containing the fluorine gas. Provision of fluorine gas in higher concentrations than 20% is often not permitted in fabrication facilities due to its highly hazardous nature, in the event of leakage.

Accordingly, the present disclosure provides the etchant gas mixture 134 as comprising fluorine up to the predetermined health safety level (e.g., approximately 20%), while the remainder of the etchant gas mixture comprises an inert, noble, or other non-reactive gas, such as helium (He), argon (Ar), krypton (Kr), xenon (Xe), or the like. The present disclosure appreciates that helium does not deleteriously impact beam current, and as such, helium is pre-mixed with fluorine for the etchant gas mixture 134. The etchant gas mixture 134, for example, can be shipped to the location of the ion implantation system 101 in a pre-mixed bottle (e.g., 20% F, 80% He), whereby the helium and fluorine are not bonded together or chemically combined, but rather, simply mixed, whereby the helium acts a dilutant. In another example, argon can also be included as a co-gas 138 with the helium and fluorine in the etchant gas mixture 134 when sputtering an aluminum-based ceramic is desired. For example, a small amount of argon can advantageously sputter and break apart any insulative coating formed on the ceramic member 136. This co-gas 138, for example, can be provided with the other gases in the etchant gas mixture 134, or can be provided separately from another source. For example, the etchant gas mixture can be a 0.5-5% concentration of argon, a 20% concentration of fluorine, and the remainder comprising helium.

Figure 2:
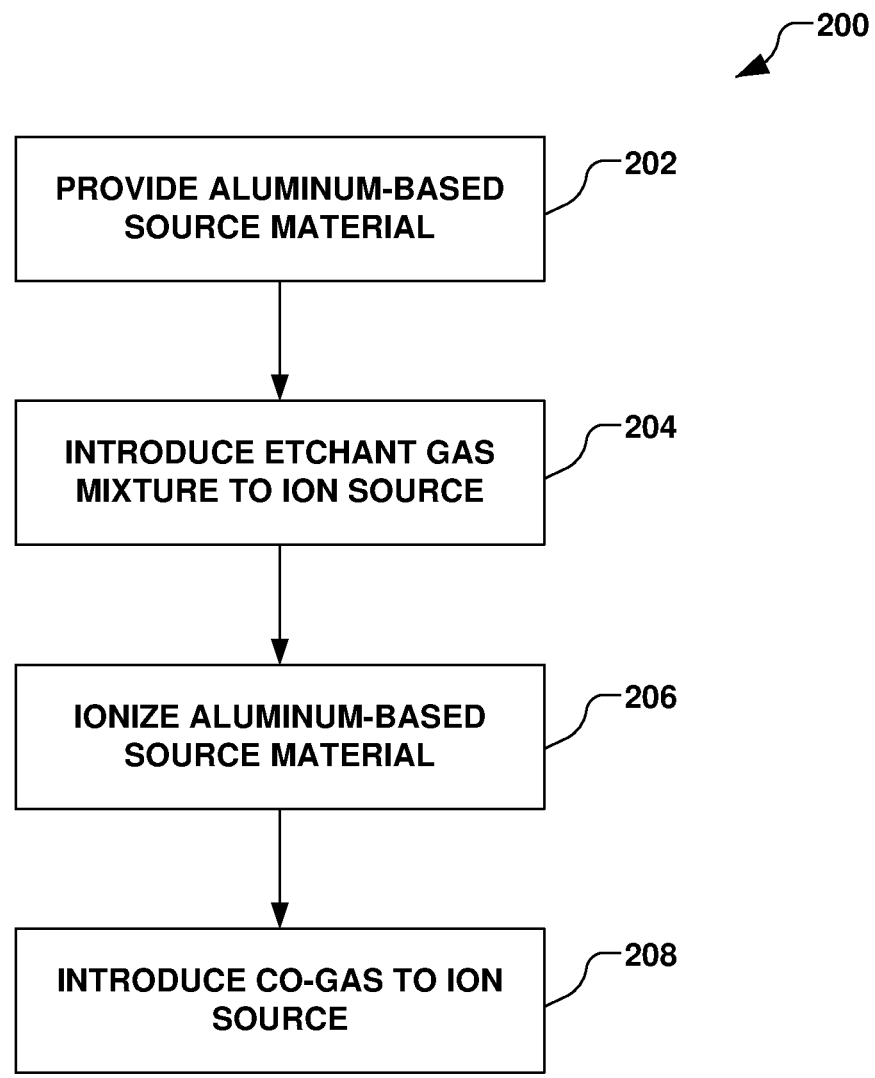
FIG. 2 illustrates an exemplary method for implanting ions into a workpiece using an aluminum-based ion source material.

FIG. 2 illustrates an exemplary method 200 for implanting ions into a workpiece. It should be further noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

In accordance with one exemplary aspect, in act 202 of FIG. 2, an aluminum source material is provided. The aluminum-based ion source material, for example, may be a ceramic member in a solid form as a component within an ion source. In act 204, for example, an etchant gas mixture is provided to the ion source. The etchant gas mixture, for example, comprises a predetermined concentration of fluorine mixed with a noble gas such as helium. In act 206, the aluminum-based ion source material is ionized in the ion source, wherein the fluorine etches the aluminum-based ion source material within the ion source to produce aluminum ions. In optional act 208, a co-gas, such as argon, is introduced to the ion source to sputter the ceramic member.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An ion implantation system, comprising:
    a ceramic member comprising an aluminum-based ion source material;
    an ion source configured to ionize the aluminum-based ion source material and form an ion beam therefrom, and whereby the ionization of the aluminum-based ion source material further forms a by-product comprising a non-conducting material, and wherein the ceramic member comprises a shield within the ion source, wherein the shield does not comprise an electrode;
    a pressurized gas source in fluid communication with the ion source, wherein the pressurized gas source contains no dopant material and comprises an etchant gas mixture comprising a predetermined concentration of fluorine gas and a noble gas, wherein the predetermined concentration of fluorine gas comprises less than approximately 20% fluorine gas;
    a beamline assembly configured to selectively transport the ion beam; and
    an end station configured to accept the ion beam for implantation of ions into a workpiece.

2. The ion implantation system of claim 1, wherein the noble gas comprises one or more of helium and argon.

3. The ion implantation system of claim 1, wherein the pressurized gas source further comprises a co-gas.

4. The ion implantation system of claim 3, wherein the co-gas comprises argon in a concentration of less than approximately 5%.

5. The ion implantation system of claim 1, wherein the etchant gas mixture is in a pre-mixed form within a pressurized bottle and comprises a mixture of the fluorine gas and one or more of argon and helium gases.

6. The ion implantation system of claim 5, wherein the pressurized bottle comprises less than approximately 5% argon.

7. The ion implantation system of claim 1, wherein the noble gas comprises a mixture of helium and argon.

8. An ion implantation system, comprising:
    a ceramic member comprising an aluminum-based source material;
    an ion source configured to ionize the aluminum-based source material and form an ion beam therefrom, and whereby the ionization of the aluminum-based source material further forms a by-product comprising a non-conducting material, wherein the ceramic member comprises a shield within the ion source, wherein the shield does not comprise an electrode;
    an etchant gas supply containing no dopant material and comprising a pressurized bottle containing an etchant gas mixture of fluorine gas mixed with a noble gas, wherein the etchant gas supply is configured to introduce the etchant gas mixture to the ion source, wherein the fluorine gas is mixed with the noble gas at a health safety concentration;
    a beamline assembly configured to selectively transport the ion beam; and
    an end station configured to accept the ion beam for implantation of ions into a workpiece.

9. The ion implantation system of claim 8, wherein the etchant gas mixture further comprises a co-gas.

10. The ion implantation system of claim 9, wherein the co-gas comprises argon.

11. The ion implantation system of claim 10, wherein the argon is at a concentration of less than approximately 5%.

12. The ion implantation system of claim 8, wherein the noble gas comprises one or more of argon and helium gases.

13. The ion implantation system of claim 8, wherein the etchant gas mixture comprises approximately 20% fluorine gas.

14. An ion implantation system, comprising:
    an ion source comprising a ceramic member comprising an aluminum-based ceramic dopant material, wherein the ceramic member comprises a shield within the ion source and does not comprise an electrode, and wherein the ion source is configured to ionize the aluminum-based ceramic dopant material and form an ion beam therefrom, and whereby the ionization of the aluminum-based ceramic dopant material further forms a by-product comprising an insulating material;
    a pressurized gas bottle in fluid communication with the ion source, wherein the pressurized gas bottle contains no dopant material and comprises an etchant gas mixture comprising a non-reacted mixture of less than approximately 20% fluorine and approximately 75% to 80% helium;
    a beamline assembly configured to selectively transport the ion beam; and
    an end station configured to accept the ion beam for implantation of ions into a workpiece.

* * * * *